United States Patent [19]
Rastegar

[11] Patent Number: 5,319,768
[45] Date of Patent: Jun. 7, 1994

[54] CONTROL CIRCUIT FOR RESETTING A SNOOP VALID BIT IN A DUAL PORT CACHE TAG MEMORY

[75] Inventor: Bahador Rastegar, Dallas, Tex.

[73] Assignee: SGS-Thomson Microelectronics, Inc., Carrollton, Tex.

[21] Appl. No.: 694,451

[22] Filed: May 1, 1991

[51] Int. Cl.⁵ .......................................... G06F 12/00
[52] U.S. Cl. .................... 395/425; 365/230.05; 364/DIG. 2
[58] Field of Search ............... 395/425; 364/200 MS, 364/900 MS; 365/230.05

[56] References Cited

U.S. PATENT DOCUMENTS

| | | | |
|---|---|---|---|
| 4,713,755 | 12/1987 | Worley, Jr. et al. | 395/375 |
| 4,959,777 | 9/1990 | Holman, Jr. | 395/325 |
| 4,977,498 | 12/1990 | Rastegar et al. | 395/425 |
| 5,056,002 | 10/1991 | Watanabe | 395/425 |
| 5,067,078 | 11/1991 | Talgam et al. | 395/400 |
| 5,072,369 | 12/1991 | Theus et al. | 395/425 |
| 5,119,485 | 6/1992 | Ledbetter, Jr. et al. | 395/425 |
| 5,146,603 | 9/1992 | Frost et al. | 395/425 |
| 5,193,170 | 3/1993 | Lam | 395/425 |

*Primary Examiner*—Glenn Gossage
*Attorney, Agent, or Firm*—Kenneth C. Hill; Lisa J. Jorgenson; Richard K. Robinson

[57] ABSTRACT

A control circuit for a dual port cache tag memory is used to reset a snoop valid bit for an entry addressed through one of the dual ports. This port snoops a main memory bus, and a cache tag hit which occurs during a write operation to the main memory bus indicates that the snoop valid bit for the addressed entry should be reset. In order to avoid errors in resetting the snoop valid bit, which errors can occur due to signal propagation delay, the control circuit resets the snoop valid bit only after a preselected internal delay period.

4 Claims, 1 Drawing Sheet

CONTROL CIRCUIT FOR RESETTING A SNOOP VALID BIT IN A DUAL PORT CACHE TAG MEMORY

CROSS REFERENCE TO RELATED APPLICATIONS

The present application contains subject matter in common with co-pending U.S. application Ser. No. 473,239, filed Jan. 31, 1990 titled DUAL-PORT CACHE TAG MEMORY, by Alex Daly and Rickie Tuttle, now abandoned, and with co-pending U.S. application Ser. No. 07/1693,670, filed Apr. 30, 1991, titled CONTROL CIRCUIT FOR DUAL PORT MEMORY by Bahador Rastegar, also now abandoned, both of which are assigned to the assignee hereof and incorporated by reference hereinto.

BACKGROUND OF THE INVENTION

1. Field of the Invention

The present invention relates generally to integrated circuit memory devices, and more specifically to a circuit and method for preventing incorrect writing of data in a dual port cache tag memory which utilizes a snoop valid bit.

2. Description of the Prior Art

One type of memory used in computer systems is a cache memory. This is a relatively small, fast memory which resides in the system between the central processor and main system memory. Cache memories include data memory fields for storing data cached from system memory, and tag memory fields for storing the addresses corresponding to the data stored in the data cache.

Some cache tag memory devices, such as that described in the application entitled DUAL-PORT CACHE TAG MEMORY, cited above, have two ports which can access a memory array asynchronously. In devices designed specifically for use as cache tag memories, one of the data ports can write data to a single bit of an entry in the array. This bit is known in the art as a "snoop valid bit", and is used to indicate that the contents of a local processor cache memory have been invalidated by processing occurring elsewhere in the computer system. When another processor or other device in the system writes data to a memory location stored in a local processor cache, that entry is no longer current. The entry is therefore marked invalid by resetting the snoop valid bit for that entry to zero.

In designs such as used by the above-cited application, the snoop valid bit for an entry can be reset to 0 only by the port which snoops the main memory bus, and once reset cannot be set to a value of 1 again until that entry is later reloaded with a new value. Thus, invalidation of an entry is an irreversible act. If invalidation occurs incorrectly, valid cache entries will be marked as invalid, causing a cache miss the next time such entries are referenced.

When cache tag memory chips are connected to provide wider entries as described in the cited application, a signal indicating a match must be communicated between the chips. If this signal is delayed in reaching the snoop bit invalidation circuitry due to parasitic capacitances, the snoop valid bit could be erroneously reset to 0.

It would therefore be desirable to provide a control circuit for dual port cache tag memories which ensures that a snoop valid bit is not erroneously reset to 0. It would be further desirable for such a control circuit to be simple to construct, and not add complexity to a memory cycle for the memory.

SUMMARY OF THE INVENTION

It is therefore an object of the present invention to provide a circuit for resetting a snoop valid bit in a cache tag memory when a cache hit occurs on the device's snoop port.

It is another object of the present invention to provide such a circuit which is simple in design and does not require complex cycle timing.

It is a further object of the present invention to provide such a circuit which does not add externally seen complexity to the memory cycle for the device, and which does not increase the cycle time when two or more memory devices are used together.

Therefore, in accordance with the present invention, a control circuit for a dual port cache tag memory is used to reset a snoop valid bit for an entry addressed through one of the dual ports. This port snoops a main memory bus, and a cache tag hit which occurs during a write operation to the main memory bus indicates that the snoop valid bit for the addressed entry should be reset. In order to avoid errors in resetting the snoop valid bit, which errors can occur due to signal propagation delay, the control circuit resets the snoop valid bit only after a preselected internal delay period.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
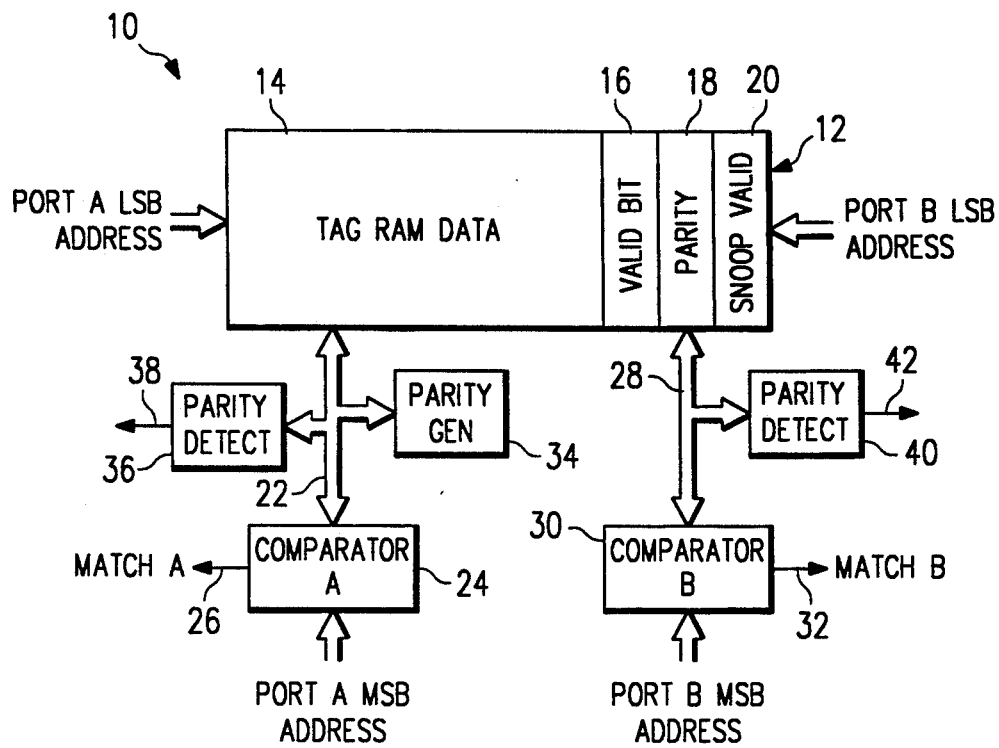
FIG. 1 is a block diagram of a cache tag memory which can utilize a control circuit according to the present invention.

FIG. 1 is a block diagram of a cache tag memory of the present invention in which a parity checking scheme may be used. The device 10 of the preferred emboeiment is a dual port cache tag memory suitable for use in a computer caching system. This device contains a bit, referred to as a snoop valid bit, for each entry in the memory. The snoop valid bit is reset to indicate that an entry is no longer valid whenever another device in the system, other than a local processor, writes data to a memory location which is stored in the cache. Additional details of such a cache tag memory, and its use in multiprocessor computer system, are described in co-pending U.S. patent application Ser. No. 473,239, filed Jan. 31, 1990, and entitled DUAL-PORT CACHE TAG MEMORY, now abandoned, which is incorporated hereinto by reference.

The device 10 includes a memory array 12. In the preferred embodiment, the memory array 12 is 12 bits wide, but it will be appreciated by those skilled in the art that various sized arrays 12 may be used in accordance with the principles of the present invention.

In the preferred embodiment, 9 bits of tag random access memory (RAM) data 14 are stored for each entry in the array. Each entry in the array 12 also includes a valid bit 16, a parity bit 18, and a snoop valid bit 20.

The valid bit 16 is used by the system to reset the entire memory array 12. Whenever an entry has a value of 0 in the valid bit field 16, that entry is considered to be invalid. According to principles known in the art, clearing of the entire memory array 12 is accomplished by simultaneously resetting all of the valid bits 16 for all entries in the array, thereby invalidating all cache entries in a single cycle. This operation is often referred to as a "flash clear". None of the memory locations in the tag (RAM) data field 14 are reset when the memory is cleared.

In the illustration of FIG. 1, the memory array 12 is a dual-port memory. This means that it may be accessed simultaneously and asynchronously by two different ports. Port A is connected to a local processor and is addressed by the local processor to determine whether a memory location to be accessed is contained within the cache memory. Port B is connected to a system bus and is used by the device 10 to "snoop" data being written on the system bus.

To determine whether an address being accessed by the local processor is contained within the data cache, the least significant bits of the local address are applied to Port A to address an entry of the memory array 12, as known in the art. The number of least significant address bits which are used to address entries in the array 12 is determined by the number of entries in the array 12. When an entry is addressed by the Port A least significant address bits, the tag data field 14 contains the most significant bits of the address location stored at the corresponding location in the data cache (not shown). These most significant bits are read out of the memory array 12 on signal lines 22, along with the valid bit, parity bit, and snoop valid bit, and compared in comparator 24 to the most significant bits of the Port A address. If the most significant bits of the Port A address match the data on signal lines 22, then the data of the memory location being addressed on Port A currently resides in the data cache corresponding to the device 10. The indication of whether or not such a match exists is generated on signal line 26. If either the valid bit 16 or the snoop valid bit 20 have a value of 0, the entry is invalid.

The same process works for addresses connected to the device 10 through Port B, which are coming from the system bus. The least significant bits of the Port B address are applied to the memory array 12, and the corresponding tag data field 14 is read out on signal line 28. As is the case with signal lines 22, signal line 28 represents a number of individual lines equal to the number of bits in the tag data field 14, plus the valid bit, parity bit, and snoop valid bit. Signal line 28 is compared to the most significant bits of the Port B address in a comparator 30, and a signal indicative of whether or not a match is found is generated on signal line 32. As before, no match is signalled if either of the valid or snoop valid bits have a value of 0, regardless of the contents of the tag data field 14. In the case of Port B, if a match is found in comparator 30, the snoop valid bit 20 corresponding to a tag memory entry which is addressed by the least significant bits of the Port B address is reset to a value of 0. The snoop valid bit 20 is reset only if such a match occurs during a system memory bus write cycle.

Whenever a new value is stored into the memory array 12 from Port A, corresponding to loading a new memory location into the cache memory, parity generator 34 generates the appropriate parity bit corresponding to the remaining bits. Whenever an entry is written into the memory 12, the snoop valid bit 20 for that entry is always set to a value of 1. The valid bit 16 is generally set to a 1 by the user when writing a new entry into the array 12, unless some special condition warrants otherwise. New entries can be written into the memory array 12 only through Port A, which is the port connected to the local processor.

When a comparison is being made through Port A, a parity detect circuit 36 reads all of the bits of the entry, including the valid bit 16, parity bit 18, and snoop bit 20, and generates a signal on line 38 indicating whether parity is valid for that entry. If a parity error occurs, various recovery techniques can be performed by the system.

Since data can be written into the memory array 12 only through Port A, except for a snoop valid bit as described below, no parity generation circuitry is required for Port B. However, a parity detect circuit 40 is required to check the parity for entries which are addressed through Port B. A signal is then put on line 42 to indicate whether parity is valid for an entry addressed through Port B.

Port B is used to "snoop" main memory locations being accessed on the system bus. Each time a memory location is accessed on the system bus, the corresponding entry is read from memory array 12 and compared to the most significant bits of the system bus address. If a match is found, then a memory location being accessed over the system bus is already stored in the local processor cache.

If a read operation is being performed on the system bus (Port B), no conflicts arise and nothing is done within the cache tag memory. However, if data is being written to the matching main memory location on the system bus, then the data stored in the cache memory is no longer valid. In this instance, the snoop valid bit for the entry selected through Port B is reset to the value of 0. This 0 value indicates that the entry is invalid, and such entry will generate a cache miss when later accessed through either Port A or Port B. This resetting of the snoop valid bit is the only situation in which Port B can write data to the memory array 12.

Figure 2:
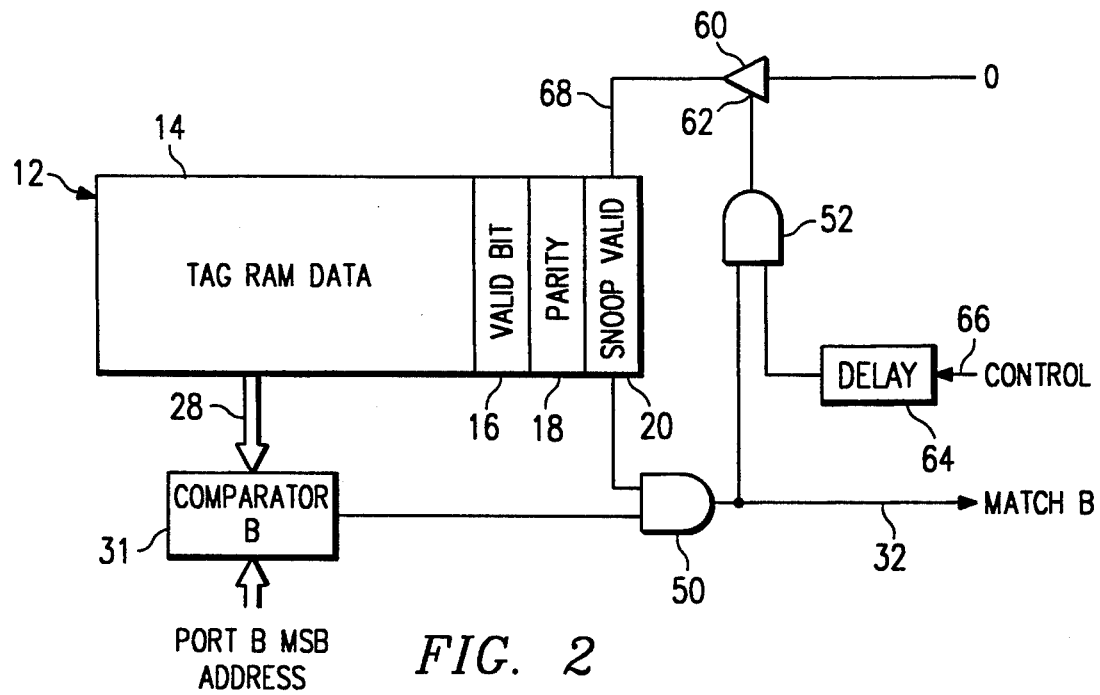
FIG. 2 is a block diagram illustrating a preferred snoop valid bit control citcuit for use with the cache tag memory of FIG. 1.

FIG. 2 illustrates a preferred control circuit for resetting the snoop valid bit through port B. Comparator 31 compares the tag data 14 for an entry addressed on port B with the most significant bits of the port B address. The valid bit 16 for the entry is checked in the comparator 31 to ensure that it has a value of 1. A logical 1 is generated by the comparator 31 if the entry in the array matches, indicating that an entry stored in the cache is being accessed over the system bus.

The output of comparator 31 is connected to AND gate 50. Comparator 31 and AND gate 50 together are equivalent to comparator 30 of FIG. 1. The snoop valid bit 20 for the entry addressed on port B is also connected to AND gate 50. The output of AND gate 50 provides the MATCH B signal on line 32 described above. The MATCH B signal is connected to an input of AND gate 52. The other input of the AND gate 52 is connected to the output of a delay circuit 64. Delay circuit 64 provides a preselected delay period for a control signal provided on signal line 66, and may include a simple inverter delay chain as known in the art.

This control signal is preferably derived from the system write signal. When a system bus write cycle is completed, the signal on line 66 goes from a logical 0 to 1 for a short period, then returns to 0. During a system bus read cycle, the signal on line 66 remains low.

A gated buffer 60 has a control input 62 connected to the output of AND gate 52. Gated buffer 60 is enabled when its control input 62 has a value of 1, and is disabled otherwise. When buffer 60 is enabled, it writes a logical 0 into the snoop valid bit 20 for the currently addressed entry over signal line 68. When disabled, buffer 60 has no effect on the value of the snoop valid bit 20.

In operation, the circuitry shown in FIG. 2 has no effect on the snoop valid bit 20 for the currently addressed entry during a system read cycle. During a system write cycle, the gated buffer 60 will be disable when a cache miss occurs. Such a miss can occur because the address stored in the tag RAM data field 14 does not match, or because the snoop valid bit 20 for the addressed entry was previously marked invalid. Therefore, the buffer 60 will be enabled only during a system bus write cycle in which a cache hit is generated. The buffer 60 will be enabled at the end of the system bus memory cycle as controlled by the delay generated by circuit 64. For fast devices, only a few nanoseconds of delay may be required. The minimum required delay is at least as great as the expected worst case delays of all signals which can affect the generation of the match signal. If several separate chips are expected to be connected so as to determine the logical state of the match signal, off-chip propagation delays must be considered.

In the preferred embodiment, the memory array 12 is an SRAM (Static Random Access Memory) array. Such memories are fast, and do not need to be refreshed. As known in the art, SRAMs generally require both a true and complement of a signal to be written into the array. Therefore, using known principles, the gated buffer 60 actually generates two complementary signals to write values into the array.

While the invention has been particularly shown and described with reference to a preferred embodiment, it will be understood by those skilled in the art that various changes in form and detail may be made therein without departing from the spirit and scope of the invention.

What is claimed is:

1. A cache tag memory device having a dual port memory array, the array having a plurality of entries, each having a tag portion and a snoop valid bit, the memory further having a first port for addressing a first array entry and a first comparator for comparing the first array entry with a portion of a first port address, and having a second port for addressing a second array entry and a second comparator for comparing the second array entry with a portion of a second port address, the cache tag memory device further comprising:

means for writing a snoop invalid value into the snoop valid bit for the second array entry addressed by the second port in response to a match signal generated by the second comparator during a write operation; and means for delaying receipt of the match signal by the means for writing for a period of time at least as great as an expected worst case delay of all signals affecting the generation of the match signal so that the means for writing is enabled only during a system bus write cycle in which a cache hit is generated.

2. A control circuit for a dual port memory having a plurality of memory entries, each entry including a snoop valid bit, the control circuit comprising:

comparator means for detecting a match between one of said memory entries and an address on a system bus, and generating a match signal when a match is detected;

a buffer for writing a first preselected value to the snoop valid bit of said one of said memory entries, the buffer having a control input for enabling the buffer to write to the snoop valid bit of said one of said memory entries;

means for providing a delayed control signal to the control input of the buffer to enable the buffer in response to the match signal, wherein the control signal indicates that a write operation is taking place on the system bus and is delayed by a period of time at least as great as an expected worst case delay of all signals affecting the generation of the match signal by the comparator means so that the buffer is enabled only during a system bus write cycle in which a match signal is generated.

3. The control circuit of claim 2, wherein the means for providing a delayed control signal comprises:

an AND gate having an output connected to the control input of the buffer, a first input for receiving the match signal, and a second input; and a delay circuit having an input for receiving the control signal and having an output connected to the second input of the AND gate.

4. The control circuit of claim 3, wherein the delay circuit comprises a plurality of inverters connected to form an inverter delay chain.

* * * * *